United States Patent [19]
Schierholz et al.

[11] 3,960,349
[45] June 1, 1976

[54] INTEGRAL, SELF RETAINING READ-OUT BLOCK

[75] Inventors: Edward A. Schierholz, Littleton; Frank Nardi, Englewood, both of Colo.

[73] Assignee: Honeywell Inc., Minneapolis, Minn.

[22] Filed: July 3, 1975

[21] Appl. No.: 592,772

[52] U.S. Cl. ............................... 248/27 R; 312/242
[51] Int. Cl.² ...................... H05K 5/00; H02B 1/62
[58] Field of Search .............. 312/7, 111, 214, 234, 312/242, 330; 248/27; 317/101 DH

[56] References Cited
UNITED STATES PATENTS

| | | | |
|---|---|---|---|
| 3,231,225 | 1/1966 | Bakke | 248/27 R |
| 3,337,076 | 8/1967 | Ast | 248/27 R |
| 3,780,353 | 12/1973 | Gordon et al. | 248/27 X |
| 3,922,047 | 11/1975 | Tsuji | 312/242 |

*Primary Examiner*—Casmir A. Nunberg
*Attorney, Agent, or Firm*—L. J. Marhoefer; L. D. Burton

[57] ABSTRACT

A self retaining read-out block has a pair of flexible legs that form separate integral spaced apart rear side surfaces of the block. The flexible nature of these legs allow each leg to be readily placed in a bowed position so that each free end can be snapped into captive engagement with a different one of two stops that are located on each of the inner side walls of the module chassis. The spring force generated in each leg while it is bent into a bowed position is used to force the read-out block and a front panel card associated therewith away from each of their associated stops and into spring loaded mounted engagement against an edge of the module chassis that forms a front opening therein.

5 Claims, 3 Drawing Figures

INTEGRAL, SELF RETAINING READ-OUT BLOCK

BACKGROUND OF THE INVENTION

1. Field of the Invention

The invention relates to a integral self-retaining read-out block construction for rapidly mounting and removing the block and its associated front panel card from a module chassis in a snap-in snap-off fashion.

2. Description of the Prior Art

Many different types of devices, such as screws, spring washers and nut connections have heretofore been employed to mount various types of objects, such as read-out blocks, on module chassis in snug physical contact with one another.

An example issued one of the prior art devices that employs such screw and nut connections for mounting instrument parts in snug contact with one another is shown in the H. A. Bakke U.S. Pat. No. 3,231,225 issues Jan. 25, 1966.

These screw, washer and nut parts are of a small size and therefore difficult to handle during mounting operations. There is also a tendency during the previously mentioned mounting operations for an operator to drop and lose some of these parts. This type of mounting device has not been satisfactory because of the excessive amount of time that is required for an operator to replace these lost parts with new ones in order to complete such a mounting operation.

SUMMARY OF THE INVENTION

In accordance with the present invention there is provided a self retaining read-out block having a pair of flexible legs that forms an integral part of the block and which extend in a cantilever fashion from the rear side surfaces thereof.

The moving of each flexible leg into a bowed position to engage each of their free ends with a stop on an associated side of the module chassis forces the block and the associated front panel card to slidable move along an inner wall of the frame part that forms an opening in the front of the chassis and into spring biased mounted engagement against a marginal front edge surface of the front frame part of the chassis.

The spring legs which form an integral part of the read-out block thus provide a self retaining read-out block construction which can be readily mounted in a module chassis without requiring any separate connections for example screws, nuts and spring washers etc.

Another object of the invention is to provide a self retaining read-out block and an associated front panel part which can readily be snapped into and out of a firmly mounted position on a module chassis by merely bowing a pair of flexible legs extending in integral cantilever fashion from the rear side surfaces of the block so that the free ends of these legs can be engaged with stops formed on an associated side wall of the module chassis.

BRIEF DESCRIPTION OF THE DRAWINGS

A better understanding of the present invention may be had when the following detailed description is read in connection with the accompanying drawing in which.

DESCRIPTION OF THE PREFERRED EMBODIMENT

Figure 1:
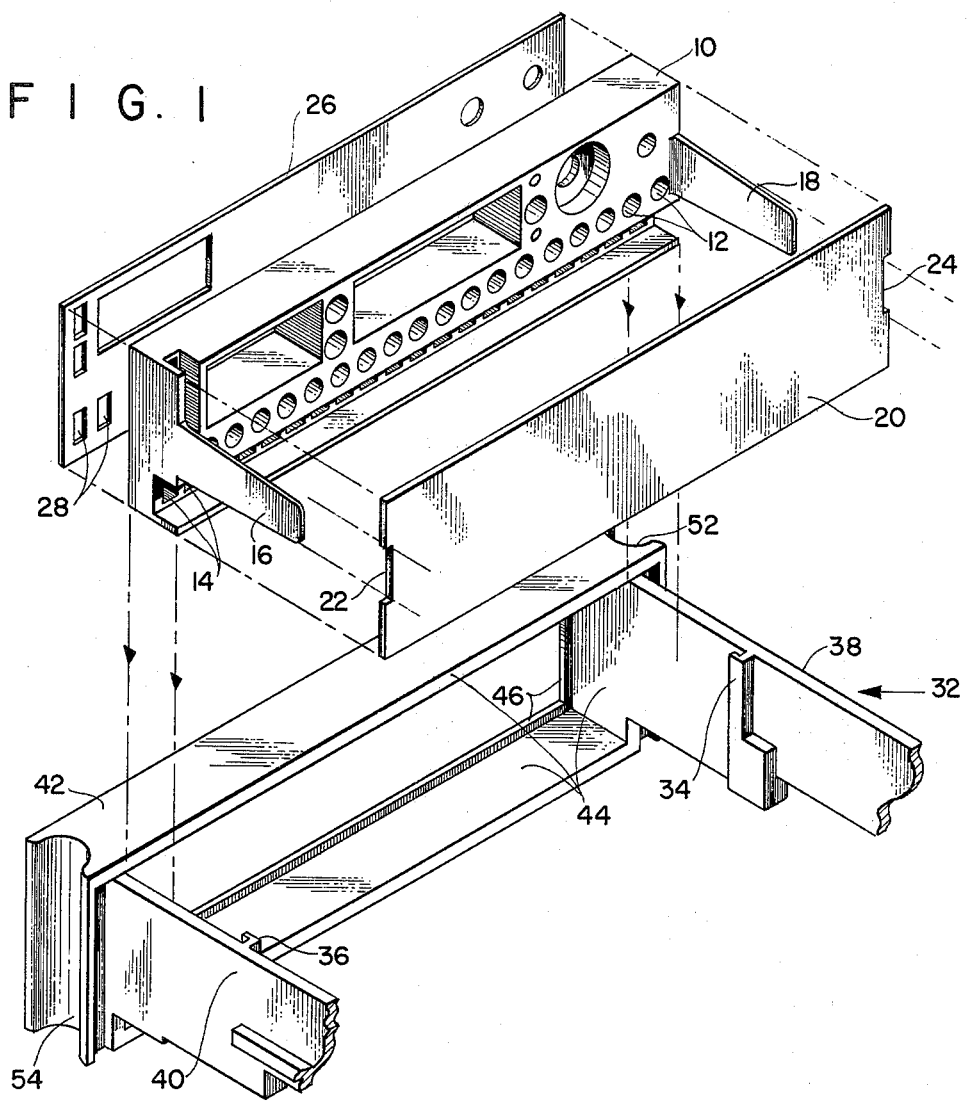
FIG. 1 shows an exploded view of the self retaining read-out block and its front and rear panel plates and also shows a front and partial side portions of the module chassis.

For an understanding of the embodiment of the invention reference will be first made to FIG. 1.

FIG. 1 shows a self retaining read-out block 10 having a plurality of slots therein for example 12. Electrical components such as light bulbs and associated push button switches, not shown, are positioned respectively in the slots 12 and 14. The rear side portions of the self retaining block 10 have two flexible legs 16 and 18 that form an integral part of the block and are shown extending in a cantilever fashion away from the block 10. The self retaining block 10 including its flexible legs 16, 18 is preferably made of a one piece molded Polycarbonate SE 1 construction.

Figure 2:
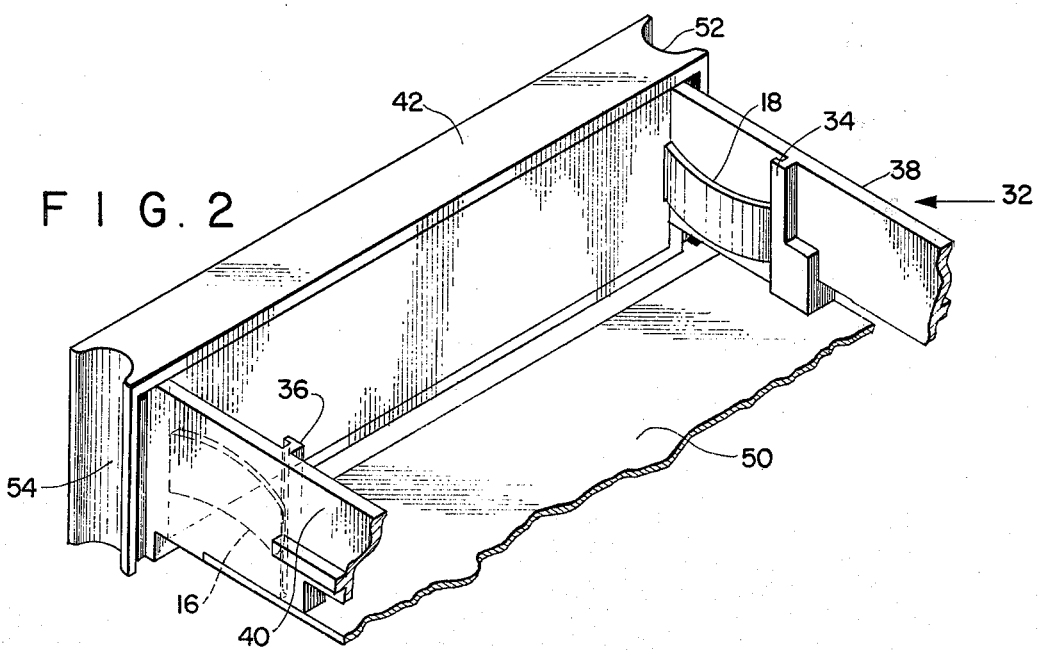
FIG. 2 is a rear prospective view showing how the flexible legs of the self retaining block are retain in a mounted position on the module chassis and FIG. 3 is a front prospective view showing how the front panel plate is retained in snug contact with the front of the module chassis by the flexible legs of the self retaining block when the legs are in the bowed position shown in FIG. 4.

The opposite ends of a printed circuit board 20 have an associated recess 22, 24 engaging in rear end portions of the legs 16; 18 as shown in FIG. 2. When this circuit board is in an assemblied position it forms a back wall of the block 10.

A transparent front panel card 26 has slots 28 that are in alignment with slots 14 in the block 10. The slots in the block 10 support the push button switches 30 as shown in FIG. 3 that extend through the slots 28 of the front panel card 26.

Figure 3:
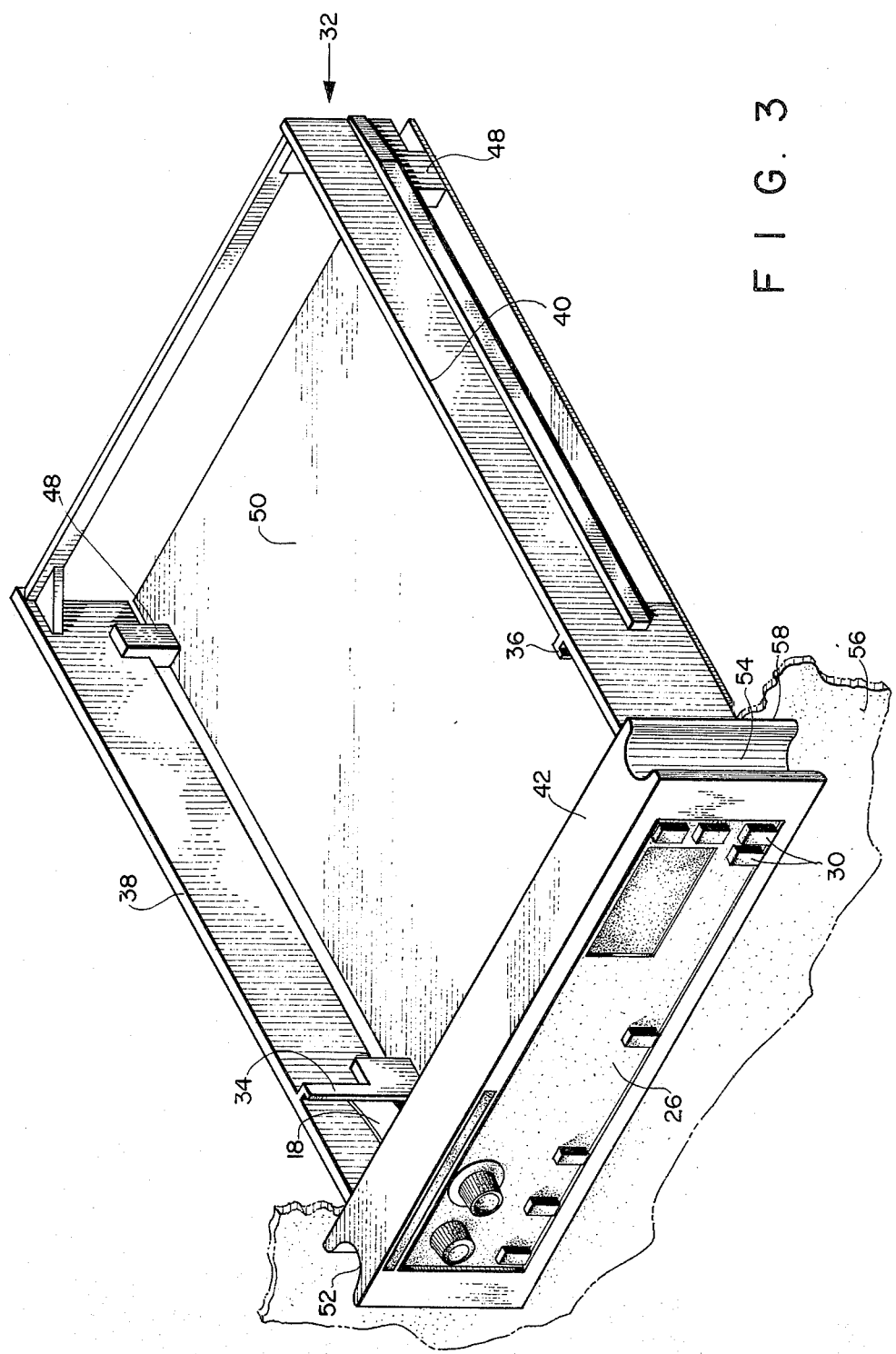

A module chassis 32, that may be of an unitary rectangular shaped frame construction as shown in FIG. 3 has angular shaped stops 34, 36 extending inwardly from its respective side wall portion 38; 40. The chassis 32 is preferably made of the same high impact type material as the block 10, namely, Polycarbonate SE 1.

As best shown in FIG. 1 the front wall portion 42 of the chassis 32 has a rectangular shaped surface 44 forming an opening that is slightly larger than the width, length and height of the read-out block 10. The face of the front wall portion 42 has a marginal edge 46 extending inwardly from the rectangular surface 44. The base of the side walls 38, 40 of the module chassis 32 each have a suitable number of lugs 48 thereon which together with the base of the stops 34, 36 provides supports to which a support plate and/or a printed circuit board 50 is attached.

The right and left ends of the front wall portions 42 of the module chassis 32 have recessed finger gripping portions 52, 54. The side wall portions 38, 40 extend through the opening in the panel 56 and the back peripheral surface 58 of the front wall portion 42, of the chassis 32, contacts the front face of the panel 56.

MODE OF OPERATION

The integral self retaining read-out block 10 and its printed circuit board 20 and the front panel card 26, with its slots in a position to surround the push buttons 30, are first moved downwardly as indicated by the dot-dash lines in FIG. 1 to a position between the forward side portions 38; 40 of the module chassis 32. The self retaining block 10 and its printed circuit 20 along with the front panel card 26 is then slidably moved as a unit along the rectangular shaped surface 44 that forms an opening in the front wall portion 42 of the module chassis 32 until the front surface of the front panel card 26 is brought into loose physical contact with the marginal edge 46.

In this position the outer side surfaces of each of the free ends of the flexible legs 16 and 18 are exerting a spring force against the top surface of the angle that forms each of their associated stops 34, 36.

The blade of a screwdriver is inserted between the inner surfaces of the side wall 38 of the module chassis 32 and side surface portion of the flexible lug 18 that is then facing the side wall 38.

After a slight finger pressure is applied to hold the free end of the flexible leg 18 in contact with the top surface of the angle shaped stop 38 the blade of the screwdriver is then canted about the inner side wall 38 to force the leg 18 into a bowed shaped position. As this bowing action of the leg 16 takes place the free end of the leg 18 is moved along the entire top surface of the stop 34 and is then snapped, by the finger pressure still being applied thereto, into a position in which its free end is in engagement with the vertical portion of the angle forming the stop 34.

This latter position of the flexible leg 16 is shown in FIGS. 2 and 3. To remove the read-out block 10 and its associated front panel card 26 the blade of the screwdriver is again inserted as before between the flexible leg 18 and the side wall 38 and a force applied to it to cant it into a bowed position until its free end snaps free of its then captured position in the angle stop 34.

The single molded Polycarbonate SE 1 construction from which the block 10 and its flexible leg portions 16, 18 are made possesses the good impact strength-flexibility that is required which the legs 16, 18 of the block are being snapped into and out of engagement with their associated stops 36, 34.

The other flexible leg 16 is employed to mount the right end of the read-out block 10 and the right end of its associated front panel card in a tightly fastened condition on and to remove it from the module chassis 32 in the same manner as that already described for the flexible leg 18.

A unitary, self retaining read-out block and module chassis construction has thus been presented herein for securely mounting a read-out block and its associated front panel in a rapid manner on a module chassis.

The embodiments of the invention in which an exclusive property or privilege is claimed are defined as follows:

1. A self retaining read-out block for effecting a secure mounting of said block and its associated front panel on a module chassis, comprising two flexible strips each forming a separate integral extendable rear side portion of said block, a front portion of said chassis having a wall surface that forms a recess therein and a marginal end portion extending inwardly from said surface, a stop formed on each one of two opposite side portions of said chassis, each of said flexible strips being adapted for movement into a bowed shaped position and into spring biased engagement with a different one of said stops to thereby force said front panel and block into stacked spring biased mounting engagement with said marginal end portion of said chassis.

2. The self retaining read-out block as defined in claim 1 wherein the dimensions of said wall surface forming said recess in said chassis is of a size to allow the read-out block to be slidable mounted therein.

3. The self retaining read-out block as defined in claim 1 wherein each of said stops are of an angular crossed shaped configuration.

4. The self retaining read-out block as defined in claim 3 wherein the free end of each of said flexible strips is adapted to be moved along and in spring baised engagement with a top flat portion of its angular shaped stop and into spring biased engagement with a side portion thereof as each of said strips are moved into each of their bowed shaped positions.

5. The self retaining read-out block as defined in claim 4 wherein the front panel card is provided with at least one slot therein and said read-out block has at least one push button extending through said slot in said front panel for supporting said card in face to face stacked engagement with said block and said marginal end portion of said chassis.

* * * * *